(12) United States Patent
Saito et al.

(10) Patent No.: US 6,469,440 B1
(45) Date of Patent: Oct. 22, 2002

(54) ELECTROMAGNETIC-WAVE SHIELDING AND LIGHT TRANSMITTING PLATE AND PANEL LAMINATED PLATE

(75) Inventors: Shinji Saito, Tokyo (JP); Shingo Ono, Tokyo (JP); Masato Sugimachi, Tokyo (JP); Masato Yoshikawa, Tokyo (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 09/576,382

(22) Filed: May 22, 2000

(30) Foreign Application Priority Data

May 28, 1999 (JP) .......................................... 11-150129
May 28, 1999 (JP) .......................................... 11-150130

(51) Int. Cl.[7] .............................................. H01J 17/16
(52) U.S. Cl. ....................... 313/582; 313/584; 313/586; 313/587
(58) Field of Search .............................. 313/582, 584, 313/586, 567, 551

(56) References Cited

FOREIGN PATENT DOCUMENTS

| EP | 0 851 452 | 7/1998 |
|----|-----------|--------|
| EP | 0 908 920 | 4/1999 |
| JP | 11-74683  | 3/1999 |
| JP | 11-119666 | 4/1999 |

OTHER PUBLICATIONS

Patent Abstract of Japan, vol. 1999, No. 08, Jun. 30, 1999 & JP11 065462 A (Nitto Denko Corp), Mar. 5, 1999.
Patent Abstract of Japan, vol. 1999, No. 09, Jul. 30, 1999 & JP11 119666 A (Bridgestone Corp), Apr. 30, 1999.
Patent Abstract of Japan, vol. 1999, No. 08, Jun. 30, 1999 & JP11 074683 A (Bridgestone corp), Mar. 16, 1999.

*Primary Examiner*—Vip Patel
*Assistant Examiner*—Ken A Berck
(74) *Attorney, Agent, or Firm*—Kanesaka & Takeuchi

(57) ABSTRACT

An electromagnetic-wave shielding and light transmitting plate is formed by two transparent base plates, a conductive mesh member, and a near infrared ray blocking film, wherein the conductive mesh member and the near infrared ray blocking film are interposed between the transparent base plates and are integrally bonded together. A panel laminated plate is formed by a transparent base plate, a PDP body, a conductive mesh member, and a near infrared ray blocking film, wherein the conductive mesh member and the near infrared ray blocking film are interposed between the transparent base plate and the PDP body and are integrally bonded together. Either in the above electromagnetic-wave shielding and light transmitting plate or in the panel laminated plate, the near infrared ray blocking film is a combination of two or more of near infrared ray blocking layers.

16 Claims, 4 Drawing Sheets

ELECTROMAGNETIC-WAVE SHIELDING AND LIGHT TRANSMITTING PLATE AND PANEL LAMINATED PLATE

BACKGROUND OF THE INVENTION AND RELATED ART STATEMENT

The present invention relates to an electromagnetic-wave shielding and light transmitting plate and a panel laminated plate of gas discharge type using a plasma display panel (hereinafter, referred to as "PDP") and, more particularly, to an electromagnetic-wave shielding and light transmitting plate suitable for a front filter of a PDP (plasma display panel), which has good electromagnetic-wave shielding capability and near infrared ray blocking capability. The present invention also relates to a panel laminated plate in which a PDP is integrated with an electromagnetic-wave shielding and light transmitting plate to impart electromagnetic-wave shielding capability to the panel laminated plate itself, thereby lightening its weight, reducing its thickness, reducing the number of parts, and thus improving the productivity and reducing the cost and, in addition, to impart near infrared ray blocking capability, thereby preventing the malfunction of a remote controller.

With the spread of electronic appliances including office apparatuses and communication instruments, electromagnetic wave emission from these appliances has come into a problem. That is, adverse effect of electromagnetic wave to the human body is feared and it is also a problem that the electromagnetic wave affects precision apparatus to cause malfunction. Therefore, plates having good electromagnetic-wave shielding efficiency and light transparency have developed as front filters for PDPs of the office automation apparatuses and come into commercial use. Such plates are also used as windows of a place where a precision apparatus is installed, such as a hospital or a laboratory in order to protect the precision apparatus from electromagnetic waves f a portable telephone.

A conventional electromagnetic-wave shielding and light transmitting plate typically comprises transparent base plates such as acrylic boards and a conductive mesh member like a wire netting and is formed by interposing the conductive mesh member between the transparent base plates and by assembling them.

The applicant of this application has proposed an electromagnetic-wave shielding and light transmitting plate, having improved characteristics and allowing easier handling as compared with the conventional one, in which a conductive mesh member is interposed between two transparent base plates and integrally bonded together by transparent adhesives (JPA 11-74683).

This electromagnetic-wave shielding and light transmitting plate has good electromagnetic shielding capability and has light transparency so that distinct pictures are displayed. Further, it has the conductive mesh member interposed between the transparent base plates, thereby preventing scattering of fragments of the transparent base panels when damaged.

On the other hand, a PDP utilizing a discharging phenomenon has the following advantages in comparison to a liquid crystal display (LCD) and a cathode ray tube (CRT). Therefore, recently it has been researched and developed for practical use, for example, televisions, office automatic apparatus such as personal computers and word processors, traffic apparatus, boards, and other kinds of display panels.

1. It utilizes discharge light so that it is spontaneous light.
2. As its discharge gap is 0.1–0.3 mm, it can be shaped in panel.
3. By using fluorescent substances, it can emit colors.
4. It eases to make wide screen.

The basic display mechanism of the PDP is displaying of letters and figures by selective discharge emitting of fluorescent substances in many discharge cells which are disposed distantly each other between two plate glasses, and for example, has a mechanism as shown in FIG. 4.

In FIG. 4, a numeral 21 designates a front glass, 22 designates a rear glass, 23 designates a bulkhead, 24 designates a display cell (discharge cell), 25 designates an auxiliary cell, 26 designates a cathode, 27 designates a display anode, 28 designates an auxiliary anode. A red fluorescent substance, a green fluorescent substance, or a blue fluorescent substance (not shown) is provided in a film form on internal walls of each display cell 24 and these fluorescent substances emit light by electrical discharges when a voltage is applied between electrodes.

From the front surface of the PDP, electromagnetic waves with frequency from several kHz to several GHz are generated due to applying voltage, electrical discharge, and light emission, and the electromagnetic waves have to be shielded.

Moreover, for improving its display contrast, reflection of external light at the front surface has to be prevented.

The PDP in which the separate transparent plate is disposed in front of the PDP has defects as follows:

1. Structure for disposing two panels is complicated.
2. As a transparent base plate made of glass or the like is required for each of the PDP and the electromagnetic-wave shielding transparent plate, the PDP and the electromagnetic-wave shielding transparent plate are made thicker and heavier in total.
3. The number of parts and labor are increased, thereby raising the cost.

To solve the aforementioned problems and to provide a display panel of a panel laminated plate in which a PDP is integrally bonded to an electromagnetic-wave shielding member to impart electromagnetic-wave shielding capability to the panel laminated plate itself, thereby lightening its weight, reducing its thickness, reducing the number of parts, and thus improving the productivity and reducing the cost and, further, to impart near infrared ray blocking capability in addition to the electromagnetic-wave shielding capability, the applicant of this application has previously proposed a display panel comprising a PDP body, an electromagnetic-wave shielding member bonded to a front surface of the PDP body by transparent adhesives, a transparent base plate bonded to a front surface of the electromagnetic-wave shielding member by transparent adhesives, which is characterized by further comprising a heat-ray blocking layer interposed between the transparent base plate and the PDP body (JPA 11-119666).

In the display panel of JPA 11-119666, the PDP, the electromagnetic-wave shielding member, the heat-ray blocking layer, and the transparent base plate are integrally bonded together by transparent adhesives, thereby lightening its weight, reducing its thickness, reducing the number of parts, and thus improving the productivity and reducing the cost. In addition, the heat-ray blocking layer is also integrally laminated on the electromagnetic-wave shielding member, thereby obtaining excellent near infrared ray blocking efficiency.

In the electromagnetic-wave shielding and light transmitting plate and the panel laminated plate, the near infrared ray blocking capability is a very-important required characteristic for the purpose of securely preventing the malfunction of a remote controller. In particular, since the producing rate of near infrared ray is increased with the improvement of brightness of PDP, further improved near infrared ray blocking capability is desired.

When an acrylic board is employed as the transparent base plate, the near infrared ray blocking capability can be imparted to the base plate just by mixing material of copper series into acrylic resin as the raw material of the base plate. However, the acrylic resin has a problem on the heat resistance, that is, the acrylic resin is poor at heat and thus may be deformed by heat. Accordingly, the acrylic resin is not preferable as the raw material of the transparent base plate of the electromagnetic-wave shielding and light transmitting plate or the panel laminated plate. Therefore, it is desired to achieve an electromagnetic-wave shielding and light transmitting plate and/or a panel laminated plate having good near infrared ray blocking capability by using glass plate having excellent heat resistance as the transparent base plate. Further, also in case of using an acrylic board, it is also desired to have improved near infrared ray blocking capability.

OBJECT AND SUMMARY OF THE INVENTION

It is an object of the present invention to solve the aforementioned problems and to provide an electromagnetic-wave shielding and light transmitting plate suitably used as an electromagnetic-wave shielding filter of a PDP which has good electromagnetic-wave shielding capability and good near infrared ray blocking capability, and having light transmitting capability so that distinct pictures are displayed.

It is another object of the present invention to provide a panel laminated plate in which a PDP is integrally bonded to an electromagnetic-wave shielding member to impart electromagnetic-wave shielding capability to the panel laminated plate itself, thereby lightening its weight, reducing its thickness, reducing the number of parts, and thus improving the productivity and reducing the cost and, further, to impart near infrared ray blocking capability in addition to the electromagnetic-wave shielding capability, thereby preventing the malfunction of a remote controller.

An electromagnetic-wave shielding and light transmitting plate of the present invention comprises at least one transparent base plate, an electromagnetic-wave shielding member, and a near-infrared ray blocking layer which are laminated and integrally bonded together, wherein said near infrared ray blocking layer is a combination of two near infrared ray blocking layers.

A panel laminated plate of the present invention comprises a plasma display panel body, an electromagnetic-wave shielding member, and a near infrared ray blocking layer which are laminated and integrally bonded together, wherein said near infrared ray blocking layer is a combination of two or more of near infrared ray blocking layers.

The electromagnetic-wave shielding and light transmitting plate of the present invention can obtain good electromagnetic-wave shielding capability and near infrared ray blocking capability because of the existence of the electromagnetic-wave shielding member and the near infrared ray blocking layer. In addition, since the near infrared ray blocking layer is composed of two or more of near infrared ray blocking layers and preferably of two or more of layer of different near infrared ray blocking materials, significantly improved near infrared ray blocking capability can be obtained by synergistic effect of the two or more of near infrared ray blocking layer.

In the electromagnetic-wave shielding and light transmitting plate of the present invention, concretely, two transparent base plates are integrally bonded to each other by transparent adhesives and said electromagnetic-wave shielding member and said near infrared ray blocking layer may be laminated between the transparent base plates or on an outer surface of the integrally bonded base plates.

The panel laminated plate of the present invention has the electromagnetic-wave shielding member and the near infrared ray blocking layer, thereby lightening its weight, reducing its thickness, reducing the number of parts, and thus improving the productivity and reducing the cost and, further the panel laminated plate can obtain good electromagnetic-wave shielding capability and near infrared ray blocking capability. In addition, since the near infrared ray blocking layer is composed of two or more of near infrared ray blocking layers and preferably of two or more of layers of different near infrared ray blocking materials, significantly improved near infrared ray blocking capability can be obtained by synergistic effect of the two or more of near infrared ray blocking layers.

In the panel laminated plate of the present invention, concretely, a transparent base plate is integrally bonded to the front surface of the plasma display panel body by transparent adhesives, said electromagnetic-wave shielding-member and said near infrared ray blocking layer are laminated between said plasma display panel body and the transparent base plate or on an outer surface of an integrally bonded unit.

In the present invention, the near infrared ray blocking layer may have the following structure:

(1) a combination of a first near infrared ray blocking film, composed of a base film on which a coating layer made of a first near infrared ray blocking material is disposed, and a second near infrared ray blocking film, composed of a base film on which a coating layer made of a second near infrared ray blocking material different from the first near infrared ray blocking material is disposed;

(2) a near infrared ray blocking film having a base film, a coating layer of a first near infrared ray blocking material disposed on one surface of the base film, and a coating layer of a second near infrared ray blocking material different from the first near infrared ray blocking material disposed on the other surface of the base film; or (3) a near infrared ray blocking film having a base film, a coating layer of a first near infrared ray blocking material, and a coating layer of a second near infrared ray blocking material different from the first near infrared ray blocking material,:in which the coating layers are laminated to each other and to a surface of the base film.

In the present invention, a conductive mesh member made of metallic fibers and/or metal-clad organic fibers is preferably used as the electromagnetic-wave shielding member and when such a conductive mesh member is used, the safety is improved because the conductive mesh member prevents scattering of fragments when damaged.

When normal adhesives are used for the integration, there is a safety problem that fragments of the electromagnetic-wave shielding and light transmitting plate or the panel laminated plate are scattered when receiving an impact. However, since transparent elastic adhesives are used as the transparent adhesives, the scattering of fragments when damaged can be prevented, thereby improving the safety.

DESCRIPTION OF PREFERRED EMBODIMENTS

Hereinafter, embodiments of electromagnetic-wave shielding and light transmitting plates of the present invention will be described with reference to the drawings.

Figure 1:
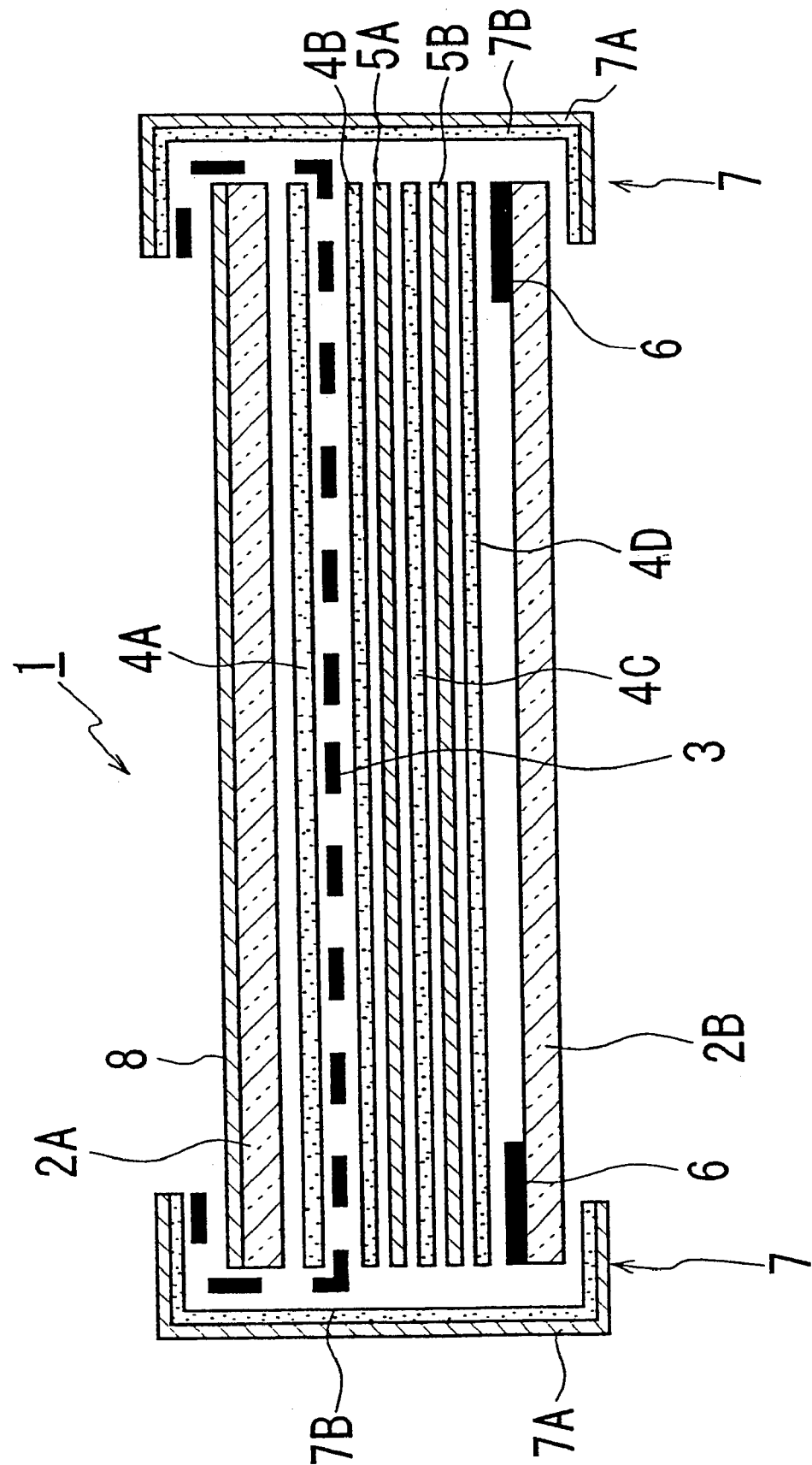
FIG. 1 is a sectional view schematically showing an embodiment of an electromagnetic-wave shielding and light transmitting plate of the present invention.
Figure 2:
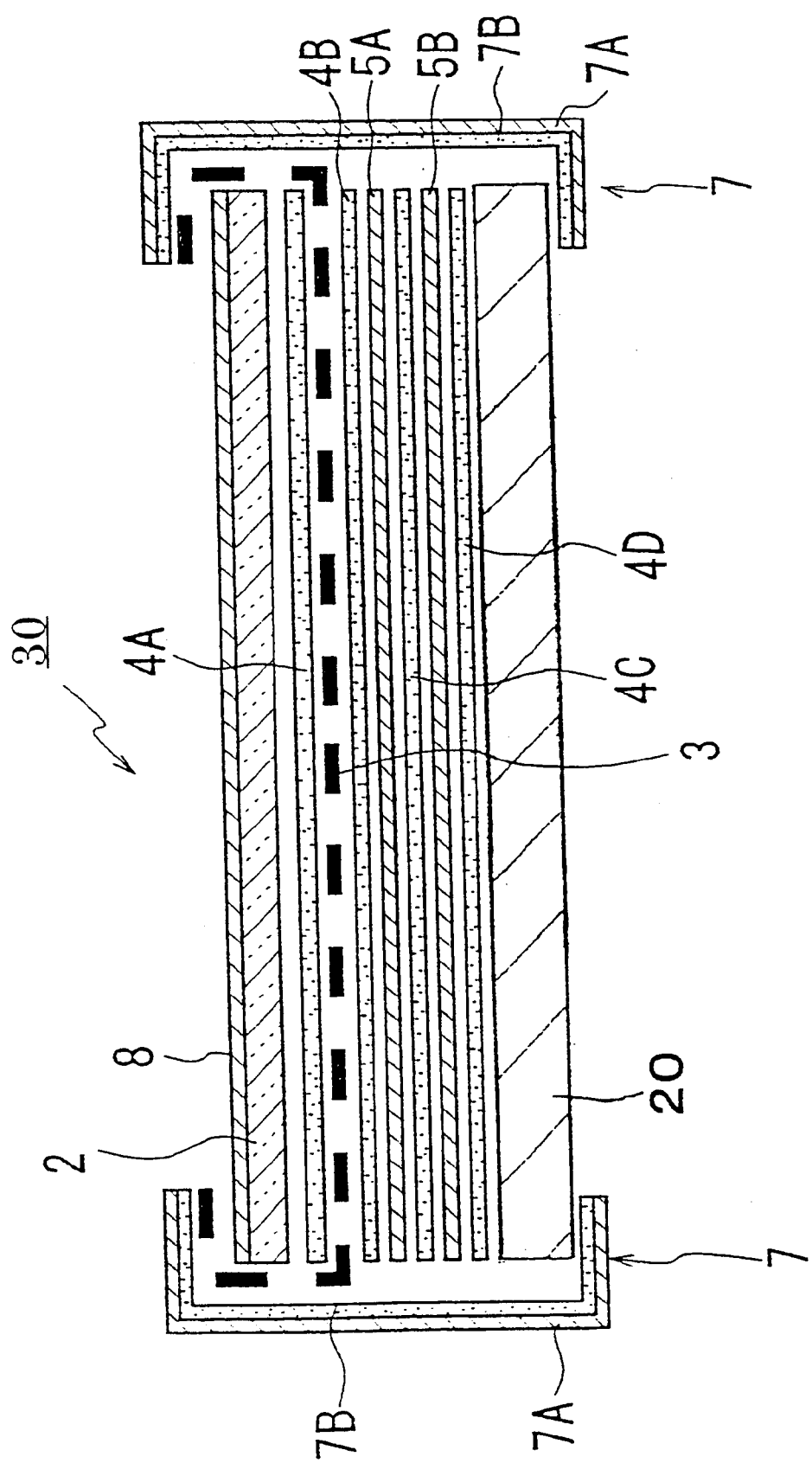
FIG. 2 is a sectional view schematically showing an embodiment of a panel laminated plate of the present invention.
Figure 3A:
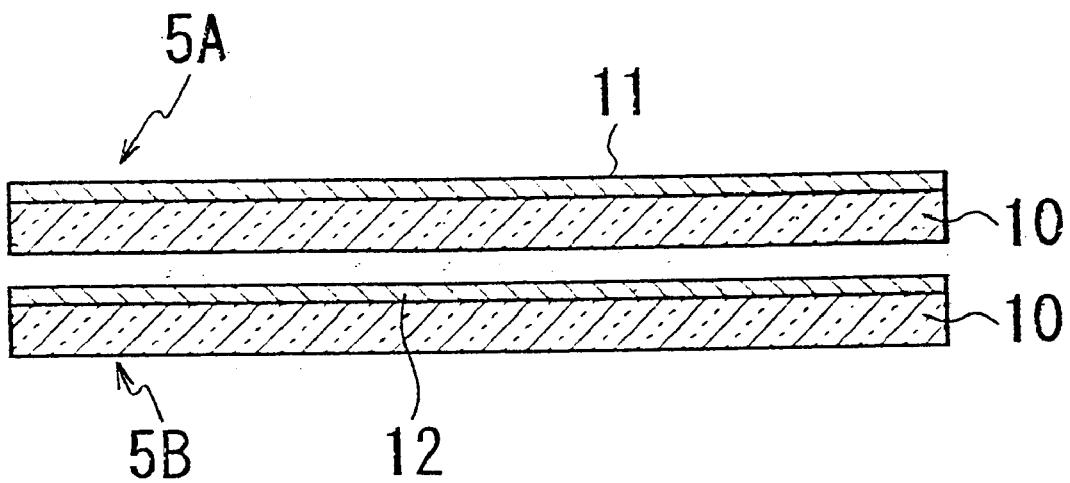
FIGS. 3a, 3b, 3c are sectional views showing embodiments of near infrared ray blocking layer according to the present invention.
Figure 3B:
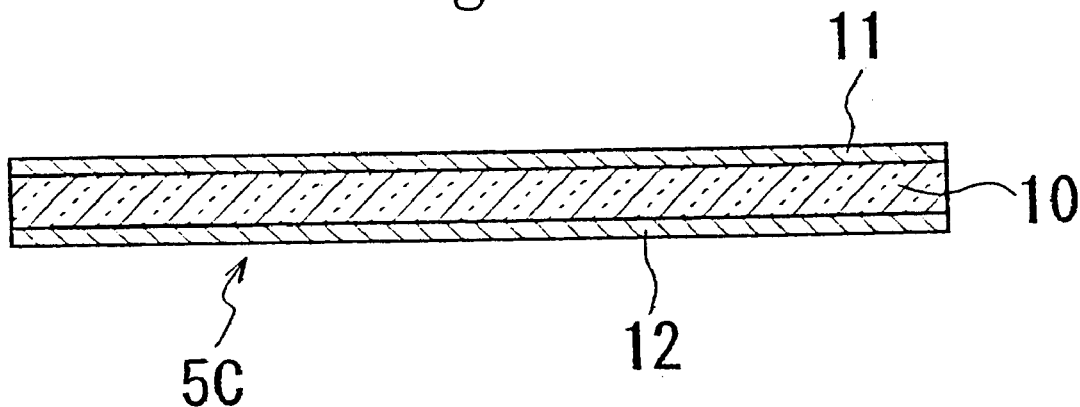
Figure 3C:
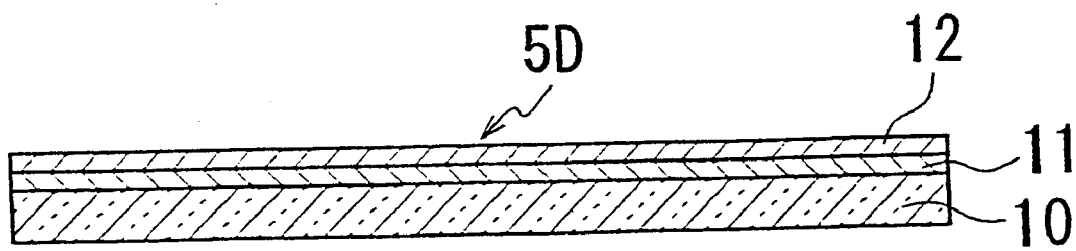

FIG. 1 is a sectional view schematically showing an embodiment of an electromagnetic-wave shielding and light transmitting plate of the present invention, FIG. 2 is a sectional view schematically showing an embodiment of a panel laminated plate of the present invention, and FIGS. 3a, 3b, 3c are sectional views showing embodiments of near infrared ray blocking layer according to the present invention.

Though an electromagnetic-wave shielding and light transmitting plate and a panel laminated plate are shown in and described with reference to FIGS. 1, 2, each of which comprises near infrared ray blocking layers (near infrared ray blocking films) and an electromagnetic-wave shielding material (conductive mesh) which are interposed between two transparent base plates or between a PDP body and a transparent base plate and are integrally bonded together by transparent adhesives, the electromagnetic-wave shielding and light transmitting plate and the panel laminated plate of the present invention are not limited to the aforementioned structure at all. The electromagnetic-wave shielding or light transmitting plate and the panel laminated plate may comprise an electromagnetic-wave shielding material and a near infrared ray blocking layer is overlaid on and integrally bonded to one transparent base plate or a PDP body. Alternatively, one or both of the electromagnetic-wave shielding material and the near infrared ray blocking layer may be overlaid on a surface not the laminated surface of the PDP body or the transparent base plate.

The electromagnetic-wave shielding and light transmitting plate 1 of FIG. 1 includes a conductive mash member 3 and a near infrared ray blocking films 5A, 5B which are interposed between two transparent base plates 2A, 2B and are integrally bonded together with adhesive intermediate films 4A, 4B, 4C, and 4D. The margins of the conductive mesh member 3 positioned outside of the peripheral edges of the transparent base plate 2A are folded along the peripheral edges of the transparent base plate 2A and are bonded to the transparent plate 2A with a conductive adhesive tape 7.

In this embodiment, the conductive adhesive tape 7 is bonded to all around ends of the assembled unit composed of the transparent base plate 2A, the conductive mesh member 3, the near infrared ray blocking films 5A, 5B, and the transparent base plate 2B in such a manner as to cover corners between surfaces and the end faces so that the conductive adhesive tape 7 is bonded to outside edges of both transparent base plates 2A, 2B.

Figure 4:
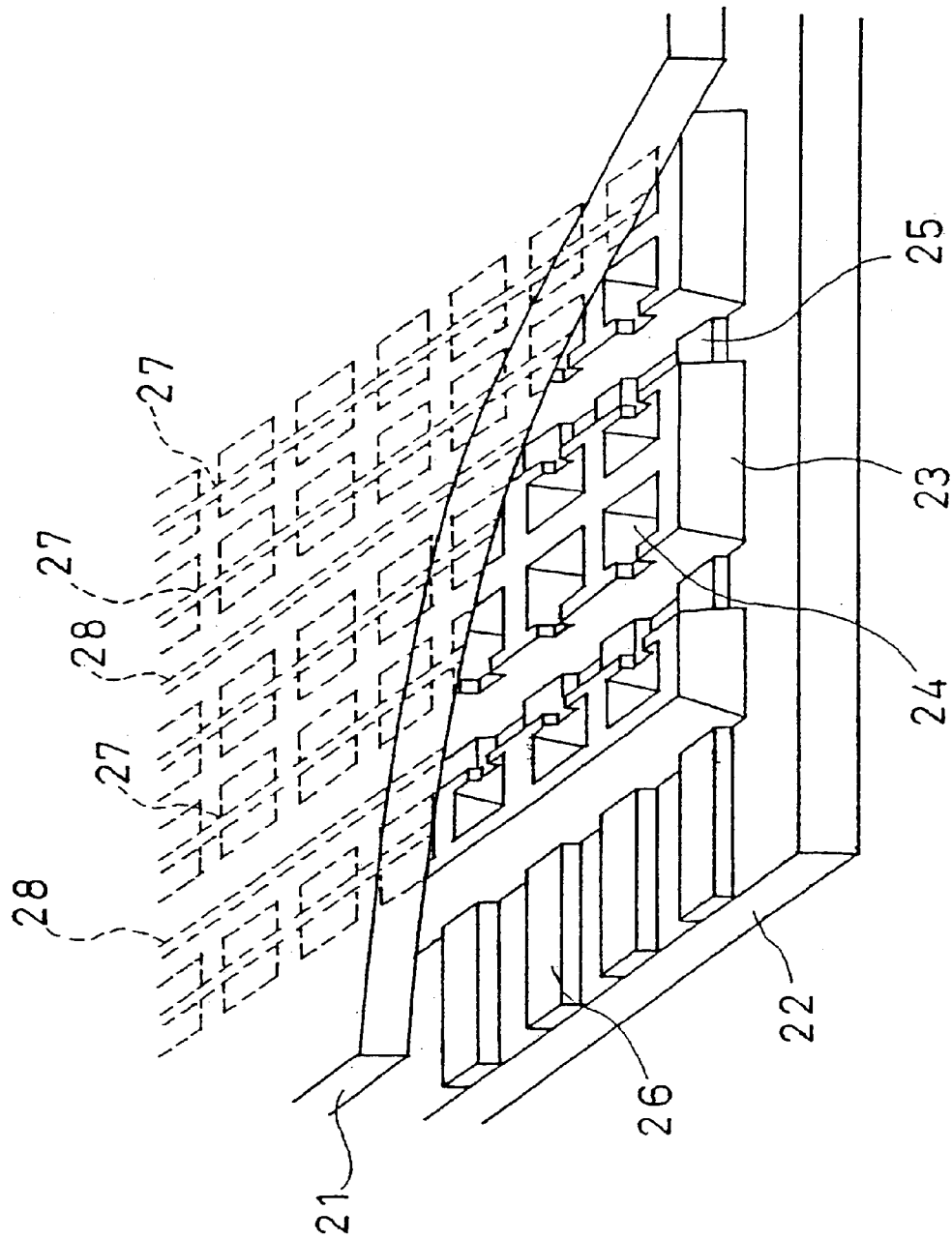
FIG. 4 is a partially perspective cut-way view showing the structure of a typical PDP.

The panel laminated plate 30 of FIG. 2 includes a conductive mash member 3 and a near infrared ray blocking films 5A, 5B which are interposed between a transparent base plate 2 and a PDP body 20 (any typical PDPs such as the PDP having the structure as shown in FIG. 4 are applicable) and are integrally bonded together with adhesive intermediate films 4A, 4B, 4C, and 4D. The margins of the conductive mesh member 3 positioned outside of the peripheral edges of the transparent base plate 2 are folded along the peripheral edges of the transparent base plate 2 and are bonded to the transparent plate 2 with a conductive adhesive tape 7.

In this embodiment, the conductive adhesive tape 7 is bonded to all around ends of the assembled unit composed of the transparent base plate 2, the conductive mesh member 3, the near infrared ray blocking films 5A, 5B, and the PDP body 20 in such a manner as to cover corners between surfaces and the end faces so that the conductive adhesive tape 7 is bonded to outside edges of both of the transparent base plate 2 and the PDP body 20.

The conductive adhesive tape 7 may comprise a metallic foil 7A and an adhesive layer 7B in which conductive particles are dispersed and which is disposed on a surface of the metallic foil 7A. The adhesive layer 7B may be composed of adhesive compound of acrylic UA type, rubber type, or silicone type or composed of epoxy resin or phenol resin mixed with hardener. Preferably, the adhesive layer 7B is a post-cross-linkable adhesive layer which contains polymer of which main component is ethylene-vinyl acetate copolymer and crosslinking agent.

Metal powder of copper, silver, or nickel, or resin or ceramic powder which is coated with the aforementioned metal may be employed as the conductive particles dispersed in the adhesive layer 7B. There is no specific limitation on its configuration so that the particles may have any configuration such as palea-like, dendritic, granular, and pellet-like configurations.

The content of the conductive particles is preferably 0.1–15% by volume relative to the polymer (described later) composing the adhesive layer 7B and the average particle size is preferably 0.1–100 $\mu$m. The restriction on the content and the particle size prevents the condensation of the conductive particles so as to obtain good conductivity.

In the cross-linkable conductive tape, the polymer forming the adhesive layer 7B preferably contains, as the principal component thereof, ethylene-vinyl acetate copolymer selected from the following (I) through (III) and has melt index (MFR) from 1 to 3000, preferably from 1 to 1000, and more preferably from 1 to 800.

Use of the following copolymers (I) through (III), of which MFR is in a range from 1 to 3000 and of which vinyl acetate content is in a range from 2 to 80% by weight, improves tackiness before cross-linking to improve the working efficiency and rises the three-dimensional cross-linking density after cross-linking, thereby exhibiting quite high bond strength and also improving the moisture and heat resistance:

(I) ethylene-vinyl acetate copolymer of which vinyl acetate content is in a range from 20 to 80% by weight;

(II) copolymer of ethylene, vinyl acetate, acrylate and/or methacrylate monomer, of which vinyl acetate content is in a range from 20 to 80% by weight, and of which acrylate and/or methacrylate monomer content is in a range from 0.01 to 10% by weight; and (III) copolymer of ethylene, vinyl acetate, maleic acid and/or maleic anhydride, of which vinyl acetate content is in a range from 20 to 80% by weight, and of which maleic acid and/or maleic anhydride content is in a range from 0.01 to 10% by weight.

In the ethylene-vinyl acetate copolymers of (I) through (III), the content of the vinyl acetate is in a range from 20 to 80% by weight, preferably from 20 to 60% by weight. Less than 20% by weight of vinyl acetate interferes with the exhibition of sufficient cross-linking in case of cross-linkage at high temperature, while more than 80% by weight decreases the softening temperature of resin in case of the ethylene-vinyl acetate copolymers of (I), (II), thereby making the storage difficult that is a problem in practical use, and tends to decrease the bond strength and the durability in case of the ethylene-vinyl acetate copolymer of (III).

In the copolymer of ethylene, vinyl acetate, acrylate and/or methacrylate monomer of (II), the content of the acrylate and/or methacrylate monomer is in a range from 0.01 to 10% by weight, preferably from 0.05 to 5% by weight. Less than 0.01% by weight of the monomer decreases the improvement of the bond strength, while more than 10% by weight tends to affect the workability. Examples of the acrylate and/or methacrylate monomer include monomers chosen from a group of acrylic ester and/or methacrylate ester monomers. Preferably employed as such a monomer is ester of acrylic acid or methacrylic acid and substituted aliphatic alcohol having non-substituting group or substituting group, such as epoxy group, including carbon atoms 1 through 20, particularly, 1 through 18. Examples include methyl acrylate, methyl methacrylate, ethyl acrylate, and glycidyl methacrylate.

In the copolymer of ethylene, vinyl acetate, maleic acid and/or maleic anhydride of (III), the content of the maleic acid and/or maleic anhydride is in a range from 0.01 to 10% by weight, preferably from 0.05 to 5% by weight. Less than 0.01% by weight of the content decreases the improvement of the bond strength, while more than 10% by weight tends to affect the workability.

The polymer according to the present invention contains more than 40% by weight, particularly more than 60% by weight, of the ethylene-vinyl acetate copolymer of (I) through (III) and preferably consists of the ethylene-vinyl acetate copolymer of (I) through (III) without other component. When the polymer contains polymer besides the ethylene-vinyl acetate copolymer, the polymer besides the ethylene-vinyl acetate copolymer may be olefin polymer of which backbone contains more than 20 mole % of ethylene and/or propylene, polyvinyl chloride, acetal resin, or the like.

The crosslinking agent for the aforementioned polymer may be organic peroxide as crosslinking agent for heat curing to form a thermosetting adhesive layer or may be photosensitizer as crosslinking agent for photo-curing to form a photo-curing adhesive layer.

Such organic peroxide may be any organic peroxide that can be decomposed at a temperature above 70° C. to generate radical, preferably organic peroxide of which decomposition temperature during half-life period of 10 hours is higher than 50° C., and should be selected according to the temperature for applying adhesive material, the preparation condition, the storage stability, the temperature for curing (bonding), and the heat resistance of the adherend.

Examples of available peroxide includes 2,5-dimethylhexane-2,5-dihydro peroxide; 2,5-dimethyl-2,5-di(tert-butyl-peroxy)-hexane-3; di-tert-butyl peroxide; tert-butylcumyl peroxide; 2,5-dimethyl-2,5-di(tert-butyl-peroxy)-hexane; dicumyl peroxide; α,α'-bis(tert-butyl peroxy)-benzene; n-butyl-4,4-bis(tert-butyl-peroxy)-valerate; 1,1-bis(tert-butyl-peroxy)-cyclohexane; 1,1-bis(tert-butyl-peroxy)-3,3,5-trimethylcyclohexane; tert-butylperoxy benzoate; benzoyl peroxide; tert-butyl peroxy acetate; methyl ethyl ketone peroxide; 2,5-dimethylhexyl-2,5-bis-peroxy-benzoate; butyl hydroperoxide; p-menthane hydroperoxide; p-chlorbenzoyl peroxide; hydroxyheptyl peroxide; chlorhexanon peroxide; octanoyl peroxide; decanoyl peroxide; lauroyl peroxide; cumyl peroxy octoate; succinic acid peroxide; acetyl peroxide; tert-butyl-peroxy (2-ethylhexanoate); m-toluoyl peroxide; tert-butyl-peroxyisobutyrate; and 2,4-dichlorobenzoyl peroxide. These are used alone or in mixed state, normally from 0.1 to 10% by weight relative to the aforementioned polymer.

On the other hand, suitably employed as such photosensitizer (photopolymerization initiator) is radical photopolymerization initiator. Available hydrogen-drawn type initiators among radical photopolymerization initiators include benzophenone; methyl o-benzoylbenzoate; 4-benzoyl-4'-methyl diphenyl sulfide; isopropylthioxanthone; diethylthioxanthone; and 4-(diethylamino) ethyl benzoate. Among radical photopolymerization initiators, intramolecular cleavage type initiators include benzoin ether, benzoin propyl ether, and benzyldimethl ketal, α-hydroxyalkyphenon type initiators include 2-hydroxy-2-methyl-1-phenylpropane-1-on, 1-hydroxycyclohexyl phenyl ketone, alkyl phenyl glyoxylate,. and diethoxy acetophenone, α-amino-alkylphenone type initiators include 2-methyl-1-[4-(methylthio)phenyl]-2-morpholino propane-1, and 2-benzyl-2-dimethylamino-1-(4-morpholino phenyl) butanone-1, and acylphosphine oxide may be employed. These are used alone or in mixed state, normally from 0.1 to 10% by weight relative to the aforementioned polymer.

The adhesive layer according to the present invention preferably includes silane coupling agent as adhesive accelerator. Examples of the silane coupling agent include vinyltriethoxysilane, vinyl-tris(β-methoxyethoxy) silane, γ-methacryloxypropyl trimethoxy silane, vinyltriacetoxy silane, γ-glycidoxypropyltrimetoxysilane, γ-glycidoxypropyltrietoxysilane, γ-(3,4-epoxycyclohexyl) ethyl trimethoxy silane, vinyltrichlorosilane, γ-mercaptopropyl trimethoxy silane, γ-aminopropyl triethoxy silane, and N-(β-aminoethyl)-γ-aminopropyl trimethoxy silane. These are used alone or in the mixed state, normally from 0.01 to 5% by weight relative to the aforementioned polymer.

The adhesive accelerator may contain epoxy group containing compound. Examples of epoxy;group containing compound include triglycidyl tris(2-hydroxy ethyl) isocyanurate, neopentyl glycol diglycidyl ether, 1,6-hexane diol diglycidyl ether, alyl glycidyl ether, 2-ethyl hexyl glycidyl ether, phenyl glycidyl ether, phenol (EO)5 glycidyl ether, p-tert-butyl phenyl glycidyl ether, diglycidylester adipate, diglycidylester phthalate, glycidyl methacrylate, and butyl glycidyl ether. The same effect can be obtained by alloying polymer containing epoxy group. These epoxy group containing compounds are used alone or in the mixed state, normally from 0.1 to 20% by weight relative to the aforementioned polymer.

In order to improve the properties (such as mechanical strength, adhesive property, optical property, heat resistance, moisture resistance, weatherability, and crosslinking speed) of the adhesive layer, a compound containing one selected from acryloxy group or methacryloxy group and one selected from allyl group may be added into the adhesive layer.

Such a compound used for this purpose is usually acrylic acid or methacrylic acid derivative, for example, ester or amide thereof. Examples of ester residues include alkyl group such as methyl, ethyl, dodecyl, stearyl, and lauryl and, besides such alkyl group, cycloxyhexyl group, tetrahydrofurfuryl group, aminoethyl group, 2-hydroethyl, 3-hydroxypropyl group, and 3-chloro-2-hydroxypropyl group. Ester with polyfunctional alcohol such as ethylene glycol, triethylene glycol, polypropylene glycol, polyethylene glycol, trimethylolpropane, or pentaerythritol may be also employed. The typical one of such amide is diacetone acrylamide. Examples of polyfunctional crosslinking aid include acrylic ester or methacrylate ester such as trimethylolpropane, pentaerythritol, glycerin, and compounds having allyl group such as triallyl cyanurate, triallyl isocyanurate, diallyl phthalate, diallyl isophthalate, and diallyl maleate. These are used alone or in the mixed state, normally from 0.1 to 50% by weight, preferably from 0.5 to 30% by weight relative to the aforementioned polymer. More than 50% by weight of the content sometimes affects the working efficiency during preparation and the applying efficiency of the adhesive material.

In order to improve the workability and the ply adhesion of the adhesive layer, hydrocarbon resin may be added into the adhesive layer. Such hydrocarbon resin to be added for this purpose may be either natural resin or synthetic resin. Examples suitably employed as natural resin are rosin, rosin derivative, and terpene resin. Employed as rosin may be gum rosin, tall oil rosin, or wood rosin. Employed as rosin derivative is rosin which has been hydrogenated, disproportioned, polymerized, esterifyed, or metallic chlorinated. Employed as terpene resin may be terpene resin, such as α-pinene and β-pinene (nopinene), or terpene phenol resin. Besides the above natural resin, dammar, copal, or shellac may be employed. Examples suitably employed as synthetic resin are petroleum resin, phenolic resin, and xylene resin. Employed as petroleum resin may be aliphatic petroleum resin, aromatic petroleum resin, cycloaliphaticb petroleum resin, copolymer petroleum resin, hydrogenated petroleum resin, pure monomer petroleum resin, or coumarone-indene resin. Employed as phenolic resin may be alkylphenolic resin or modified phenolic resin. Employed as xylene resin may be xylene resin or modified xylene resin. The content of the hydrocarbon resin should be suitably selected, preferably from 1 to 200% weight, more preferably from 5 to 150% weight relative to the polymer.

The adhesive layer may further include antioxidant, ultraviolet absorbing agent, dye, and/or processing aid in such an amount not to affect the object of the present invention.

Examples of metal of the metallic foil 7A as the base of the cross-linkable conductive adhesive tapes 7B of the second aspect include copper, silver, nickel, aluminum, or stainless steel. The thickness of the metallic foil is normally in a range from 1 to 100 $\mu$m.

The adhesive layer 7B is made of mixture in which the ethylene-vinyl acetate copolymer, cross-linking agent, other additives if necessary, and conductive particles are mixed uniformly in a predetermined ratio, and can be easily formed by applying the mixture onto the metallic foil 7A using a roll coater, a die coater, a knife coater, a micabar coater, a flow coater, a spray coater or the like.

The thickness of the adhesive layer 7B is normally in a range from 5 to 100 $\mu$m.

In the present invention, examples of material of the transparent base plates 2A, 2B, 2 include glass, polyester, polyethylene terephthalate (PET), polybutylene terephthalate, polymethyl methacrylate (PMMA), acrylic board, polycarbonate (PC), polystyrene, triacetate film, polyvinyl alcohol, polyvinyl chloride, polyvinylidene chloride, polyethylene, ethylene-vinyl acetate copolymer, polyvinylbutyral, metal ionic crosslinked ethylene-methacrylic copolymer, polyurethane, and cellophane. Preferably selected from the above materials are glass, PET, PC, and PMMA.

The thicknesses of the transparent base plates 2A, 2B, 2 are suitably determined in accordance with requirements (e.g. strength, light weight) due to the application of a plate to be obtained and are normally in a range from 0.1 to 10 mm.

The transparent base plates 2A, 2B are not necessarily made of the same material. For example, in a case of a PDP front filter of which only the front surface is required to have scratch resistance and durability, the transparent base plate 2A as the front surface may consist of a glass plate having a thickness of 1.0 to 10 mm and the transparent base plate 2B as the rear surface (at the electromagnetic wave source side) may consist of a PET film or PET board, an acrylic film or acrylic board, or a polycarbonate film or polycarbonate board having a thickness of 1 $\mu$m to 10 mm.

In the electromagnetic-wave shielding and light transmitting plate 1 of this embodiment, acrylic resin-based black painting 6 is provided in a flame shape on the peripheral portion of the rear surface of the transparent base plate 2B.

In the electromagnetic-wave shielding and light transmitting plate 1 and the panel laminated plate 30 of these embodiments, an antireflection film 8 is formed on the surface of the transparent base plate 2A, 2 as the front surface. The antireflection film 8 formed on the surface of the transparent base plate 2A, 2 is a film or a laminated film of a high-refractive transparent film and a low-refractive transparent film and examples of the film or the laminated films are as follows:

(1) a film consisting of a refractive transparent film less than the transparent face plate;
(2) a laminated film consisting of a high-refractive transparent film and a low-refractive transparent film, i.e. two films in total;
(3) a laminated film consisting of two high-refractive transparent films and two low-refractive transparent films which are alternately laminated, i.e. four films in total;
(4) a laminated film consisting of a medium-refractive transparent film, a high-refractive transparent film, and a low-refractive transparent film, i.e. three films in total; and
(5) a laminated film consisting of three high-refractive transparent films and three low-refractive transparent films which are alternately laminated, i.e. six films in total.

As the high-refractive transparent film, a film, preferably a transparent conductive film, having a refractive index of 1.8 or more can be made of ZnO, $TiO_2$, $SnO_2$, or ZrO in which ITO (tin indium oxide) or ZnO, Al is doped. On the other hand, as the low-refractive transparent film, a film can be made of low-refractive material having a refractive index of 1.6 or less such as $SiO_2$, $MgF_2$, or $Al_2O_3$. The thicknesses of the films vary according to the film structure, the film kind, and the central wavelength because the refractive index in a visible-light area is reduced by interference of light. In case of four-layer structure, the antireflection film is formed in such a manner that the first layer (high-refractive transparent film) is from 5 to 50 nm, the second layer (low-refractive transparent film) is from 5 to 50 nm, the third layer (high-refractive transparent film) is from 50 to 100 nm, and the fourth layer (low-refractive transparent film) is from 50 to 150 nm in thickness.

The antireflection film 8 may be further formed with an antifouling film to improve the fouling resistance of the surface. The antifouling film is preferably a fluorocarbon or silicone film having a thickness in a range from 1 to 1000 nm.

In the electromagnetic-wave shielding and light transmitting plate and the panel laminated plate of the present invention, the transparent base plate 2A or 2 as the front surface may be processed by hard coating with material of silicone series and/or anti-glare finish by hard coating including light-scattering agent to improve its function. In addition, the aforementioned anti-reflection film, the hard coating film, and/or the anti-glare film may be attached: to the transparent base plate 2A or 2 with transparent sticker or transparent adhesives. On the other hand; the transparent base plate 2B as the rear surface may be processed by heat ray reflection coating with a metallic film or a transparent conductive film to improve its function. Such a transparent conductive film may be formed on the transparent base,plate 2A, 2 as the front surface.

The near infrared ray blocking film 5A or 5B comprises a base film, a coating layer of a transparent conductive material such as copper series, phthalocyanine series, zinc oxide, silver, and ITO (indium-tin oxide) or a near infrared ray blocking material such as nickel complex, and immonium, the coating layer being formed on the base film. The base film is preferably a film made of PET, PC, PMMA, or the like. The thickness of this film is preferably in a range between 10 μm and 20 mm to prevent the thickness of the resultant electromagnetic-wave shielding and light transmitting plate from being too thick to ensure its easy handling and its durability. The thickness of the heat-ray blocking coating, which is formed on this base film, is usually from 500 Å to 5000 Å.

According to the present invention, the near infrared ray blocking films are preferably made of two or more of the aforementioned materials.

In the embodiment of FIGS. 1 and 2, the near infrared ray blocking films 5A, 5B having coating layers made of different near infrared ray blocking materials are used together. That is, as shown in FIG. 3*a,* the near infrared ray blocking film 5A in which a coating layer of a near infrared ray blocking material 11 is formed on a base film 10 and the near infrared ray blocking film 5B in which a coating layer of a near infrared ray blocking material 12 different from the near infrared ray blocking material 11 is formed on a base film 10 are used together. The present invention is not limited thereto and, as shown in FIG. 3*b,* a near infrared ray blocking film 5C may be employed in which a coating layer made of the near infrared ray blocking material 11 is formed on one surface of a base film 10 and a coating layer made of the near infrared ray blocking material 12 different from the near infrared ray blocking material 11 is formed on the other surface of the base film 10. Alternatively, as shown in FIG. 3*c,* a near infrared ray blocking film 5D may be employed in which a coating layer of the near infrared ray blocking material 11 and a coating layer of the near infrared ray blocking material 12 are both formed on one surface of a base film 10.

Alternatively, the near infrared ray blocking film 5A may be interposed between the two transparent base plates 2A and 2B or between the PDP body 20 and the transparent base plate 2 and the near infrared ray blocking film 5B may be bonded to the outside of the transparent base plate 2B with transparent adhesives (stickers).

Three or more of near infrared ray blocking materials may be used together. Any combination of the near infrared ray blocking films 5A-5D as shown in FIGS. 3*a*–3*c* may be used.

According to the present invention, not to lose the light transparency and to obtain good near infrared ray blocking capability, it is preferable that two or more of near infrared ray blocking materials having different near infrared ray blocking characteristics are used in combination as follows:

(a) a coating layer made of ITO having a thickness from 100 Å to 5000 Å;

(b) a coating layer made of an alternative lamination of ITO and silver having a thickness from 100 Å to 10000 Å;

(c) a coating layer having a thickness from 0.5 to 50 microns made by forming a film from a mixture of a nickel complex and immonium with a suitable transparent binder; and (d) a coating layer having a thickness from 10 to 10000 microns made by forming a film from a copper compound including bivalent copper ion with a suitable transparent binder.

From the above (a) to (d), a combination of (a) and (c), a combination of (a) and (d), a combination of (a) and (e), a combination of (b) and (c), a combination of (b) and (d), or a combination of (b) and (e) is preferably employed.

According to the present invention, in addition to the near infrared ray blocking film, a transparent conductive film may be interposed between the transparent base plates or between the transparent base plate and the PDP body. In this case, the transparent conductive film may comprise a resin film in which conductive particles are dispersed or a base film on which a transparent conductive layer is formed.

The conductive particles may be any particles having conductivity and the following are examples of such conductive particles.

(i) carbon particles or powder;

(ii) particles or powder of metal such as nickel, indium, chromium, gold, vanadium, tin, cadmium, silver, platinum, aluminum, copper, titanium, cobalt, or lead, alloy thereof, or conductive oxide thereof; and (iii) particles made of plastic such as polystyrene and polyethylene, which are surfaced with coating layer of a conductive material from the above (i) and (ii).

Because the conductive particles of large particle diameter affect the light transparency and the thickness of the transparent conductive film, it is preferable that the particle diameter is 0.5 mm or less. The preferable particle diameter of the conductive particles is between 0.01 and 0.5 mm.

The high mixing ratio of the conductive particles in the transparent conductive film spoils the light transparency, while the low mixing ratio makes the electromagnetic-wave shielding efficiency low. The mixing ratio of the conductive particles is therefore preferably between 0.1 and 50% by weight, particularly between 0.1 and 20% by weight and more particularly between 0.5 and 20% by weight, relative to the resin of the transparent conductive film.

The color and the luster of the conductive particles can be suitably selected according to the application. In a case of a display filter, conductive particles having a dark color such as black or brown and dull surfaces are preferable. In this case, the conductive particles can suitably adjust the light transmittance of the filter so as to make the display easy-to-see.

Such a transparent conductive layer on the base film may be made of tin indium oxide, zinc aluminum oxide, or the like by one of methods including vacuum evaporation, sputtering, ion plating, and CVD (chemical vapor deposit). In this case, when the thickness of the transparent conductive layer is less than 0.01 μm, sufficient electromagnetic-wave shielding efficiency can not be obtained, because the thickness of the conductive layer for the electromagnetic-wave shielding is too thin, and when exceeding 5 μm, light transparency may be spoiled.

Examples of matrix resin of the transparent conductive film include polyester, polyethylene terephthalate (PET), polybutylene terephthalate, polymethyl methacrylate (PMMA), acrylic board, polycarbonate (PC), polystyrene, triacetate film, polyvinyl alcohol, polyvinyl chloride, polyvinylidene chloride, polyethylene, ethylene-vinyl acetate copolymer, polyvinylbutyral, metal ionic cross-linked ethylene-methacrylic copolymer, polyurethane, and cellophane. Preferably selected from the above resins are PET, PC, and PMMA.

The thickness of the transparent conductive film is normally in a range from 1 μm to 5 mm.

By adding the transparent conductive film, excellent electromagnetic-wave shielding efficiency can be obtained.

The conductive mesh member 3 interposed between the transparent base plates 2A and 2B or between the transparent base plate 2 and the PDP body 20 is made of metallic fibers and/or metal-clad organic fibers. In the present invention, to improve the light transparency and to prevent the moire phenomenon, for example, the conductive mesh member 3 preferably has a wire diameter from 1 μm to 1mm and an open area ratio from 40 and 95%.

When the wire diameter is less than 1 μm, it reduces the strength of the mesh member to make the handling significantly difficult. When the open area ratio is more than 95%, it is difficult to maintain the mesh configuration. On the other hand, when the open area ratio is less than 40%, too low light transmittance is provided so as to reduce the light from the display. It is more preferable that the wire diameter is between 10 and 500 μm and the open area ratio is between 50 and 90%.

The ratio of opening areas of the conductive mesh member means the ratio of areas, where the openings occupy, relative to the projected area of the conductive mesh member.

Examples of metal of metallic fibers and metal-coated organic fibers constituting the conductive mesh member 3 include copper, stainless steel, aluminum, nickel, titanium, tungsten, tin, lead, iron, silver, chrome, carbon, or alloy thereof. Preferably selected from the above are copper, stainless steel, and aluminum.

Examples of organic material of the metal-coated organic fibers include polyester, nylon, vinylidene chloride, aramid, vinylon, and cellulose.

In the present invention, a conductive mesh made of metal-clad organic fibers having excellent characteristics of maintaining the mesh configuration is preferably used in order to maintain the aforementioned open area ratio and the wire diameter.

Either in the electromagnetic-wave shielding and light transmitting plate shown in FIG. 1 or in the panel laminated plate 30 shown in FIG. 2, the conductive, mesh member 3 is formed to have an area larger than that of the transparent base plates 2A, 2B, 2 so that the periphery thereof is positioned outside of peripheral edges of transparent base plates 2A, 2B, 2 so as to form margins when it is interposed therebetween and is folded along the peripheral edges of the transparent base plate 2A, 2.

As the adhesive resin for bonding the transparent base plates 2A, 2B or the transparent base plate 2 and the PDP body 20 through the conductive mesh member 3 and the near infrared ray blocking films 5A, 5B, a transparent adhesive resin having elasticity is preferably used, for example, adhesive resins normally used as adhesives for laminated glasses For example, copolymers of ethylene group, such as ethylene-vinyl acetate copolymer, ethylene-methyl acrylic copolymer, ethylene-(meth) acrylic copolymer, ethylene-ethyl (meth) acrylic copolymer, ethylene-methyl (meth) acrylic copolymer, metal ionic cross-linked ethylene-(meth) acrylic copolymer, partial saponified ethylene-vinyl acetate copolymer, calboxylated ethylene-vinyl acetate copolymer, ethylene-(meth) acrylic-maleic anhydride copolymer, and ethylene-vinyl acetate-(meth) acrylate copolymer. It should be noted that "(meth) acrylic" means "acrylic or methacrylic". Besides the above resins, polyvinyl butyral (PVB) resin, epoxy resin, acrylic resin, phenol resin, silicon resin, polyester resin, or urethane resin may also be employed. The best one among them is ethylene-vinyl acetate copolymer (EVA) because it can offer the best balance of performance and can be easily handled. In terms of the impact resistance, the perforation resistance, the adhesive property, and the transparency, PVB resin often used for laminated safety glasses for automobile is also preferable.

It is preferable that the PVB resin contains polyvinyl acetal between 70 and 95% by unit weight and polyvinyl acetate between 1 and 15% by unit weight, and has an average degree of polymerization between 200 and 3000, preferably 300 and 2500. The PVB resin is used as resin composition containing plasticizer.

Examples of plasticizer in the PVB resin composition include organic plasticizers, such as monobasic acid ester and polybasic acid ester, and phosphoric acid plasticizers.

Preferable examples of such monobasic acid ester are ester as a result of reaction of organic acid, such as butyric acid, isobutyric acid, caproic acid, 2-ethylbutyric acid, heptoic acid, n-octyl acid, 2-ethylhexyl acid, pelargonic acid (n-nonyl acid), or decyl acid, and triethylene glycol and, more preferably, are triethylene-di-2-ethylbthyrate, triethylene glycol-di-2-ethylhexoate, triethylene glycol-di-caproate, and triethylene glycol-di-n-ocotoate. Ester of one of the above organic acids and tetraethylene glycol or tripropylene glycol may be also employed.

Preferable examples of plasticizers of polybasic acid ester group are ester of organic acid, such as adipic acid, sebacic acid, or azelaic acid, and straight chain like or brunch like alcohol with from 4 to 8 carbon atoms and, more preferably, are dibutyl sebacate, dioctyl acetate, and dibutyl carbitol adipate.

Examples of phosphoric acid plasticizers include tributoxyethyl phosphate, isodecyl phenyl phosphate, and tri-isopropyl phosphate.

Insufficient plasticizer in the PVB resin composition reduces the film-forming property, while excessive plasticizer spoils the durability during high temperature. Therefore, the amount of plasticizer in the PVB resin composition is between 5 and 50 parts by weight, preferably between 10 and 40 parts by weight, per 100 parts by weight of polyvinyl butyral resin.

The PVB resin composition may further include, in small amounts, stabilizer, antioxidant, and/or ultraviolet absorbing agent.

Hereinafter, the description will now be made as regard to the adhesive intermediate film according to the present invention, by means of an example using EVA as the adhesive resin.

EVA in which the contents of vinyl acetate is between 5 and 50% by weight, preferably between 15 and 40% by weight, is employed. Less than 5% by weight of vinyl acetate interferes with the weatherability and the transparency, while exceeding 40% by weight of vinyl acetate significantly reduces mechanical characteristics, makes the film forming difficult, and produces a possibility of blocking between films.

Suitably employed as the crosslinking agent when the EVA is crosslinked by heating is organic peroxide which is selected according to the temperature for sheet process, the temperature for crosslinking agent, and the storage stability. Examples of available peroxide include 2,5-dimethylhexane-2,5-dihydro peroxide; 2,5-dimethyl-2,5-di(tert-butyl-peroxy)-hexane-3; di-tert-butyl peroxide; tert-butylcumyl peroxide; 2,5-dimethyl-2,5-di(tert-butyl-peroxy)-hexane; dicumyl peroxide; α,α'-bis(tert-butyl peroxy)-benzene; n-butyl-4,4-bis(tert-butyl-peroxy)-valerate; 2,2-bis(tert-butyl-peroxy)-butane, 1,1-bis(tert-butyl-peroxy)-cyclohexane; 1,1-bis(tert-butyl-peroxy)-3,3,5-trimethylcyclohexane; tert-butyl peroxy benzoate; benzoyl peroxide; tert-butyl peroxy acetate; 2,5-dimethyl-2,5-bis(tert-butyl-peroxy)-hexyne-3; 1,1-bis(tert-butyl-peroxy)-3,3,5-trimethylcyclohexane; 1,1-bis(tert-butyl-peroxy)-cyclohexane; methyl ethyl ketone peroxide; 2,5-dimethylhexyl-2,5-bis-peroxy-benzoate; tert-butyl-hydroperoxide; p-menthane hydroperoxide; p-chlorbenzoyl peroxide; tert-butyl peroxyisobutyrate; hydroxyheptyl peroxide; and chlorohexanon peroxide. These are used alone or in mixed state, normally less than 10 parts by weight, preferably from 0.1 to 10 parts by weight per 100 parts by weight of EVA.

The organic peroxide is normally mixed to the EVA by an extruder or a roll mill or may be added to the EVA film by means of impregnation by dissolving the peroxide into organic solvent, plasticizer, or vinyl monomer.

In order to improve the properties (such as mechanical strength, optical property, adhesive property, weatherability, blushing resistance, and crosslinking speed) of the EVA, a compound containing one selected from acryloxy group or methacryloxy group and one selected from allyl group may be added into the EVA. Such a compound used for this purpose is usually acrylic acid or methacrylic acid derivative, for example, ester or amide thereof. Examples of ester residues include alkyl group such as methyl, ethyl, dodecyl, stearyl, and lauryl and, besides such alkyl group, cycloxyhexyl group, tetrahydrofurfuryl group, aminoethyl group, 2-hydroethyl, 3-hydroxypropyl group, and 3-chloro-2-hydroxypropyl group. Ester with polyfunctional alcohol such as ethylene glycol, triethylene glycol, polyethylene glycol, trimethylolpropane, or pentaerythritol may be also employed. The typical one of such amide is diacetone acrylamide.

More concretely, examples include compounds containing polyfunctional ester such as acrylic ester or methacrylate such as trimethylolpropane, pentaerythritol and glycerin, or allyl group such as triallyl cyanurate, triallyl isocyanurate, diallyl phthalate, diallyl isophthalate, and diallyl maleate. These are used alone or in the mixed state, normally from 0.1 to 2 parts by weight, preferably from 0.5 to 5 parts by weight per 100 parts by weight of EVA.

When the EVA is crosslinked by light, photosensitizer is used instead of the above peroxide, normally less than 10 parts by weight, preferably from 0.1 to 10 parts, by weight per 100 parts by weight of EVA.

In this case, examples of available photosensitizer include benzoin; benzophenone; benzoin methyl ether; benzoin ethyl ether; benzoin isopropyl ether; benzoin isobutyl ether; dibenzyl; 5-nitroaniline; hexachlorocyclopentadiene; p-nitrodiphenyl; p-nitroaniline; 2,4,6-trinitroaniline; 1,2-benzanthraquinone; and 3-methyl-1,3-diazo-1,9-benzanthrone. These can be used either alone or in the mixed state.

In this case, silane coupling agent is further used as adhesive accelerator. Examples of the silane coupling agent include vinyltriethoxysilane, vinyl-tris (β-methoxyethoxy) silane, γ-methacryloxypropyl trimethoxy silane, vinyltriacetoxy silane, γ-glycidoxypropyltrimetoxysilane, γ-glycidoxypropyltrietoxysilane, β-(3,4-epoxycyclohexyl) ethyl trimethoxy silane, γ-chloropropyl methoxy silane, vinyltrichlorosilane, γ-mercaptopropyl trimethoxy silane, γ-aminopropyl triethoxy silane, and N-(β-aminoethyl)-γ-aminopropyl trimethoxy silane.

These are used alone or in the mixed state, normally from 0.001 to 10 parts by weight, preferably from 0.001 to 5 parts by weight per 100 parts by weight of EVA.

The adhesive intermediate films may further include, in small amounts, ultraviolet ray absorbing agent, infrared ray absorbing agent, antioxidant, and/or paint processing aid. For adjusting the color of the filter itself, the adhesive intermediate films may further include coloring agent such as dye and pigment, and/or filler such as carbon black, hydrophobic silica, and calcium carbonate.

It is also effective that the intermediate adhesive layers in sheet condition are surfaced by corona discharge process, low temperature plasma process, electron beam irradiation process, or ultraviolet irradiation process as measures of improving the adhesive property.

The intermediate adhesive layers according to the present invention can be manufactured for example, by first mixing the adhesive resin and the additives listed above, kneading them by an extruder or a roll, and after that, forming in a predetermined configuration by means of a film forming method such as;.calendering, rolling, T-die extrusion, or inflation. During the film formation, embossing is provided for preventing the blocking between sheets and facilitating the deaerating during compressed onto the transparent base plate.

The thickness of the adhesive layer consisting of the conductive mesh member 3, the near infrared ray blocking films 5A, 5B, and adhesive intermediate films 4A–4D can vary according to the application of the electromagnetic-wave shielding and light transmitting plate or the panel laminated plate and is normally between 2 μm and 2 mm. Therefore, each adhesive intermediate film 4A–4D is formed to have such a thickness to make the adhesive layer having the aforementioned thickness.

To manufacture the electromagnetic-wave shielding and light transmitting plate 1 as shown in FIG. 1, the transparent base plate 2A on which anti-reflection film 8 is formed, the transparent base plate 2B of which periphery is painted with black border 6, the near infrared ray blocking films 5A, 5B, the conductive mesh member 3, the adhesive intermediate films 4A, 4B, 4C; 4D, and the conductive adhesive tape are first prepared. The conductive mesh member 3 and the near infrared ray blocking films 5A, 5B sandwiched by adhesive intermediate films 4A, 4B, 4C, 4D respectively are interposed between the transparent base plate 2A and the transparent base plate 2B, compressed under the hardened condition of the adhesive intermediate films 4A, 4B, 4C, 4D, and then heated or irradiated to integrate them. The margins of the conductive mesh member 3 are folded and the conductive adhesive tape 7 is further bonded around of the assembled unit to fix the folded margins onto the surface and is bonded according to a hardening method, such as thermo compression bonding, suitable for the employed conductive adhesive tape 7.

To manufacture the panel laminated plate 30 as shown in FIG. 2, the transparent base plate 2 on which anti-reflection film 8 is formed, the PDP body 20, the near infrared ray blocking films 5A, 5B, the conductive mesh member 3, the adhesive intermediate films 4A, 4B, 4C, 4D, and the conductive adhesive tape are first prepared. The conductive mesh member 3 and the near infrared ray blocking films 5A, 5B sandwiched by adhesive intermediate films 4A, 4B, 4C, 4D respectively are interposed between the transparent base plate 2 and the PDP body 20, compressed under the hardened condition of the adhesive intermediate films 4A, 4B, 4C, 4D, and then heated or irradiated to integrate them. The margins of the conductive mesh member 3 are folded and the conductive adhesive tape 7 is further bonded around of the assembled unit to fix the folded margins onto the surface and is bonded according to a hardening method, such as thermo compression bonding, suitable for the employed conductive adhesive tape 7.

When using the cross-linkable conductive adhesive tape as the conductive adhesive tape 7, the tape is bonded to the assembled unit by the tackiness of the adhesive layer 7B (this temporal adhesion allows re-adhesion if necessary) and is then heated or radiated with ultraviolet with some pressures as necessary. The ultraviolet radiation may be applied at the same time of heating. The cross-linkable conductive tape may be partially bonded by partially heating or radiating ultraviolet.

The thermo compression bonding can be easily conducted by a typical heat sealer. As one of compression and heating methods, a method may be employed that the integrated member bonded with the cross-linkable conductive adhesion tape is inserted into a vacuum bag which is then vacuumed and after that is heated. Therefore, the bonding operation is quite easy.

The bonding condition in case of thermal cross-linking depends on the type of crosslinking agent (organic peroxide) to be employed. The cross-linking is conducted normally at a temperature from 70 to 150° C., preferably from 70 to 130° C. and normally for 10 seconds to 120 minutes, preferably 20 seconds to 60 minutes.

In case of optical cross-linking, many light sources emitting in an ultraviolet to visible range may be employed. Examples include an extra-high pressure, high pressure, or low pressure mercury lamp, a chemical lamp, axenon lamp, a halogen lamp, a Mercury halogen lamp, a carbon arc lamp, an incandescent lamp, and a laser radiation. The period of radiation is not limited because it depends on the type of lamp and the strength of the light source, but normally in a range from dozens of seconds to dozens of minutes. In order to aid the cross-linking, ultraviolet may be radiated after previously heating to 40–120° C.

The pressure for bonding should be suitably selected and is preferably 5–50 kg/cm$^2$, particularly 10–30 kg/cm$^2$.

The electromagnetic-wave shielding and light transmitting plate 1 or the panel laminated plate 30 onto which the conductive adhesive tape 7 is bonded can be simply and easily built in the body of the equipment only by fitting it in the body of the equipment and can provide uniform conduction along the peripheral direction between the conductive mesh member 3 and the body of the equipment through the conductive adhesive tape 7, thereby exhibiting good electromagnetic-wave shielding efficiency and exhibiting good near infrared ray blocking efficiency because of the existence of the near infrared ray blocking films 5A, 5B.

It should be noted that the electromagnetic-wave shielding and light transmitting plate shown in FIG. 1 and the panel laminated plate shown in FIG. 2 are just examples of the present invention, so the present invention is not limited to the illustrative examples. For example, only one film as shown in FIGS. 3b, 3c may be used as the near infrared ray blocking film as mentioned above or the near infrared ray blocking film may be used together with a transparent conductive film. Further, a transparent conductive film may be formed directly on the surface of the transparent base plate 2B, the surface of the transparent base plate 2, or the front surface of the PDP body 20. The electromagnetic-wave shielding and light transmitting plate and the panel laminated plate may include the following transparent conductive film formed on the transparent base plates 2B, 2:

(1) a metal film formed in a lattice or punching metal-like arrangement by coating a photo-resist, exposing a pattern, etching, and then developing the desired pattern on the surface of the transparent base plate; and (2) a printed film formed in a lattice or punching metal-like arrangement by printing conductive ink on the surface of the transparent base plate.

Either in the electromagnetic-wave shielding and light transmitting plate or in the panel laminated plate, instead of the transparent conductive film, metallic foil which is formed in a lattice or punching metal-like arrangement by pattern etching may be bonded on the front surface of the transparent base plate or the PDP body. Either in the electromagnetic-wave shielding and light transmitting plate or in the panel laminated plate, instead of the conductive mesh member, the above-mentioned metallic foil or a transparent conductive member may be used as the electromagnetic-wave shielding material to be interposed between the transparent base plates or between the transparent base plate and the PDP body.

The electromagnetic-wave shielding and light transmitting plate of the present invention can be suitably used as a front filter of PDP and a window of a place where a precision apparatus is installed, such as a hospital or a laboratory.

Hereinafter, the effects of the present invention will be described in detail with regard to experimental examples indicating improved efficiencies on the near infrared ray blocking capability by using two or more of different near infrared ray blocking materials.

Experimental Example 1

A PET film of which thickness is 100 microns was employed as the base film. Each coating layers of near infrared ray blocking material was formed on one surface of the base film to have the following thickness.

In this manner, near infrared ray blocking films A, B, C were prepared.

Near infrared ray blocking film A: an alternative lamination of ITO and silver of which total thickness is 4000 Å;

Near infrared ray blocking film B: a coating layer formed by a near infrared ray blocking material of immonium series with polyester binder to have thickness of 5 microns; and Near infrared ray blocking film C: a coating layer formed by a near infrared ray blocking material of nickel complex series with acrylic binder to have thickness of 5 microns.

These near infrared ray blocking films A, B, C were laminated as shown in Table 1 to form laminated units. The light transmittance of each laminated unit in a range of near infrared ray was measured using a spectrophotometer. Based on the measured values, the near infrared ray blocking efficiency was analyzed. The results are shown in Table 1.

TABLE 1

| NEAR INFRARED RAY BLOCKING FILM LAMINATING METHOD | NEAR INFRARED RAY BLOCKING EFFICIENCY |
|---|---|
| Two near infrared ray blocking films A are laminated | Exhibiting excellent blocking efficiency a range of wave length above 950 nm |
| Two near infrared ray blocking films B are laminated | Exhibiting excellent blocking efficiency in a range of wave length from 900 nm to 1000 nm |
| Two near infrared ray blocking films C are laminated | Exhibiting excellent blocking efficiency in a range of wave length around 850 nm |
| One near infrared ray blocking film A and one near infrared ray blocking film B are laminated | Exhibiting excellent blocking efficiency in a range of wave length above 900 nm |
| One near infrared ray blocking film A and one near infrared ray blocking film C are laminated | Exhibiting excellent blocking efficiency in a range of wave length above 850 nm (Best Balance) |
| One near infrared ray blocking film B and one near infrared ray blocking film C are laminated | Exhibiting excellent blocking efficiency in a range of wave length from 850 nm to 1000 nm |

It can be found from Table 1 that good near infrared blocking efficiency can be obtained by the lamination of a plurality of near infrared ray blocking layers, more preferably the combination of different near infrared ray blocking materials.

As described above, the present invention can provide an electromagnetic-wave shielding and light transmitting plate suitably used as an electromagnetic-wave shielding filter for PDP which has good electromagnetic-wave shielding capability and good near infrared ray blocking capability, and has light transparency so that distinct pictures are displayed and, in addition, which can prevent the malfunction of a remote controller.

Further, in the panel laminated plate of the present invention, a PDP is integrally bonded to an electromagnetic-wave shielding member to impart electromagnetic-wave shielding capability to the panel laminated plate itself, thereby lightening its weight, reducing its thickness,. reducing the number of parts, and thus improving the productivity and reducing the cost.

Also in the panel laminated plate of the present invention, a near infrared ray blocking layer is also integrally bonded so as to impart near infrared ray blocking capability in addition to the electromagnetic-wave shielding capability, thereby preventing the malfunction of a remote controller and reducing the heat ray radiated from a display.

What is claimed is:

1. An electromagnetic-wave shielding and light transmitting plate comprising at least one transparent base plate, an electromagnetic-wave shielding member, and a near-infrared ray blocking layer which are laminated and integrally bonded together, said near infrared ray blocking layer consisting essentially of at least one base film and at most two near infrared ray blocking materials laminated on the at least one base film.

2. An electromagnetic-wave shielding and light transmitting plate as claimed in claim 1, wherein two transparent base plates are integrally bonded to each other by transparent adhesives and said electromagnetic-wave shielding member and said near infrared ray blocking layer are laminated between the transparent base plates or on an outer surface of the integrally bonded base plates.

3. An electromagnetic-wave shielding and light transmitting plate as claimed in claim 1, wherein said near infrared ray blocking layer consists essentially of a first near infrared ray blocking film composed of a first base film and a coating layer made of a first near infrared ray blocking material; and a second near infrared ray blocking film composed of a second base film and a coating layer made of a second near infrared ray blocking material different from the first near infrared ray blocking material.

4. An electromagnetic-wave shielding and light transmitting plate as claimed in claim 1, wherein said near infrared ray blocking layer consists essentially of a near infrared ray blocking film having a base film, a coating layer of a first near infrared ray blocking material disposed on one surface of the base film, and a coating layer of a second near infrared ray blocking material different from the first near infrared ray blocking material disposed on the other surface of the base film.

5. An electromagnetic-wave shielding and light transmitting plate as claimed in claim 1, wherein said near infrared ray blocking layer consists essentially of a near infrared ray blocking film having a base film, a coating layer of a first near infrared ray blocking material laminated on one surface of the base film, and a coating layer of a second near infrared ray blocking material different from the first near infrared ray blocking material and laminated on the coating layer of the first near infrared ray blocking material.

6. An electromagnetic-wave shielding and light transmitting plate as claimed in claim 1, wherein said electromagnetic-wave shielding member comprises a mesh member made of at least one of metallic fibers and metal-clad organic fibers.

7. An electromagnetic-wave shielding and light transmitting plate as claimed in claim 2, wherein said transparent adhesives are transparent elastic adhesives.

8. A panel laminated plate comprising a plasma display panel body, an electromagnetic-wave shielding member, and a near infrared ray blocking layer which are laminated and integrally bonded together, said near infrared ray blocking layer consisting essentially of at least one base film and at most two near infrared ray blocking materials laminated on the at least one base film.

9. A panel laminated plate as claimed in claim 8, further comprising a transparent base plate integrally bonded to a front surface of the plasma display panel body by transparent adhesives, said electromagnetic-wave shielding member and said near infrared ray blocking layer being laminated between said plasma display panel body and the transparent base plate or on an outer surface of an integrally bonded unit of the plasma display panel body and the transparent base plate.

10. A panel laminated plate as claimed in claim 8, wherein said near infrared ray blocking layer consists essentially of a first near infrared ray blocking film composed of a first base film and a coating layer made of a first near infrared ray blocking material; and a second near infrared ray blocking film composed of a second base film and a coating layer made of a second near infrared ray blocking material different from the first near infrared ray blocking material.

11. A panel laminated plate as claimed in claim 8, wherein said near infrared ray blocking layer consists essentially of a near infrared ray blocking film having a base film, a coating layer of a first near infrared ray blocking material disposed on one surface of the base film, and a coating layer of a second near infrared ray blocking material different from the first near infrared ray blocking material disposed on the other surface of the base film.

12. A panel laminated plate as claimed in claim 8, wherein said near infrared ray blocking layer consists essentially of a near infrared ray blocking film having a base film, a coating layer of a first near infrared ray blocking material laminated on one surface of the base film, and a coating layer of a second near infrared ray blocking material different from the first near infrared ray blocking material and laminated on the coating layer of the first near infrared ray blocking material.

13. A panel laminated plate as claimed in claim 8, wherein said electromagnetic-wave shielding member comprises a mesh member made at least one of metallic fibers and metal-clad organic fibers.

14. A panel laminated plate as claimed in claim 9, wherein said transparent adhesives are transparent elastic adhesives.

15. An electromagnetic-wave shielding and light transmitting plate as claimed in claim 1, wherein said near infrared ray blocking layer consists of two near infrared ray blocking materials different from each other and one or two base films laminated together.

16. A panel laminated plate as claimed in claim 8, wherein said near infrared ray blocking layer consists of two near infrared ray blocking materials different from each other and one or two base films laminated together.

* * * * *